(12) United States Patent
Sato et al.

(10) Patent No.: US 7,973,361 B2
(45) Date of Patent: Jul. 5, 2011

(54) HIGH BREAKDOWN VOLTAGE SEMICONDUCTOR DEVICE AND FABRICATION METHOD OF THE SAME

(75) Inventors: Yoshinobu Sato, Osaka (JP); Hiroyoshi Ogura, Kyoto (JP); Hisao Ichijo, Kyoto (JP); Teruhisa Ikuta, Nara (JP); Toru Terashita, Osaka (JP)

(73) Assignee: Panasonic Corporation, Osaka (JP)

( * ) Notice: Subject to any disclaimer, the term of this patent is extended or adjusted under 35 U.S.C. 154(b) by 581 days.

(21) Appl. No.: 11/362,116

(22) Filed: Feb. 27, 2006

(65) Prior Publication Data
US 2006/0220130 A1    Oct. 5, 2006

(30) Foreign Application Priority Data

Mar. 30, 2005  (JP) ................................ 2005-098896

(51) Int. Cl.
*H01L 31/113* (2006.01)
(52) U.S. Cl. ........ 257/339; 257/345; 257/347; 257/403; 257/409; 257/329; 257/349
(58) Field of Classification Search .................. 257/329, 257/345, 347, 403, 409, 339, 349
See application file for complete search history.

(56) References Cited

U.S. PATENT DOCUMENTS

| 6,380,566 B1 * | 4/2002 | Matsudai et al. ............. 257/175 |
| 6,693,339 B1 * | 2/2004 | Khemka et al. ............... 257/492 |
| 6,828,631 B2 * | 12/2004 | Rumennik et al. ............ 257/342 |

FOREIGN PATENT DOCUMENTS

| JP | 08-148684 | 6/1996 |
| JP | 2004-096083 | 3/2004 |

OTHER PUBLICATIONS

Chinese Office Action, with English translation, issued in Chinese Patent Application No. 200610067980.2, mailed Mar. 27, 2009.

* cited by examiner

*Primary Examiner* — Samuel A Gebremariam
(74) *Attorney, Agent, or Firm* — McDermott Will & Emery LLP

(57) ABSTRACT

A high breakdown voltage semiconductor device is formed using an SOI substrate comprising a support substrate, an insulating film, and an active layer. The high breakdown voltage semiconductor device comprises an N-type well region and a P-type drain offset region formed on the active layer, a P-type source region formed on the well region, a P-type drain region formed on the drain offset region, a gate insulating film formed in at least a region interposed between the source region and the drain offset region of the active layer, and a gate electrode formed on the gate insulating film. The device further comprises an N-type deep well region formed under the drain offset region. A concentration peak of N-type impurity for formation of the deep well region is located deeper than a concentration peak of P-type impurity for formation of the drain offset region.

5 Claims, 8 Drawing Sheets

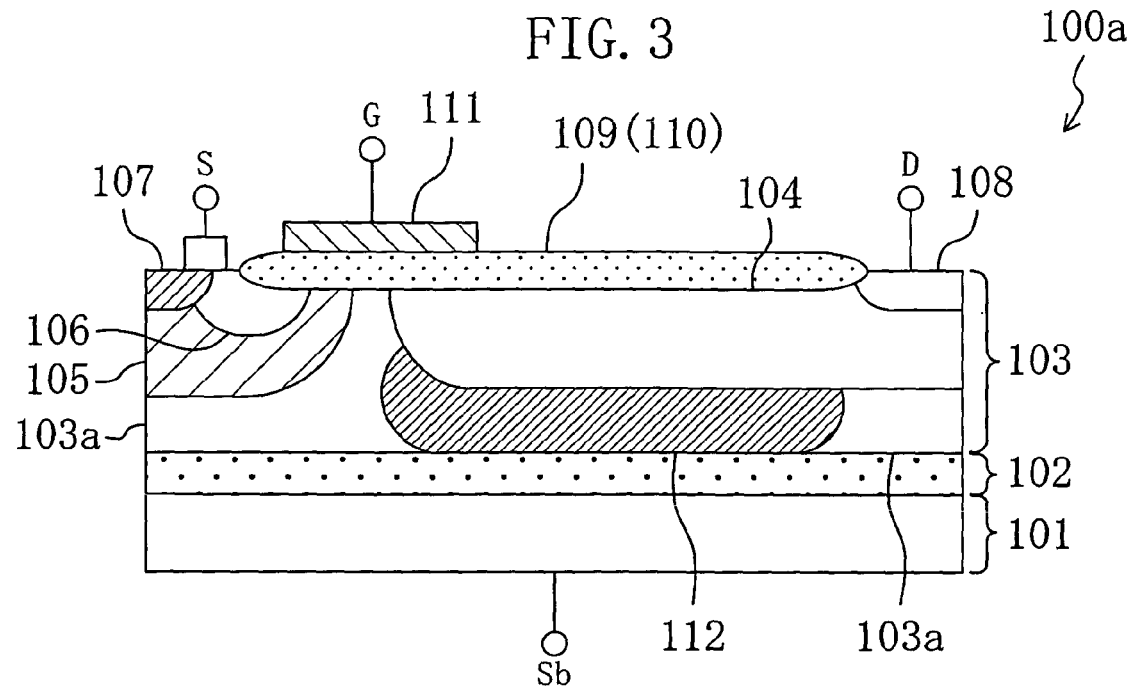
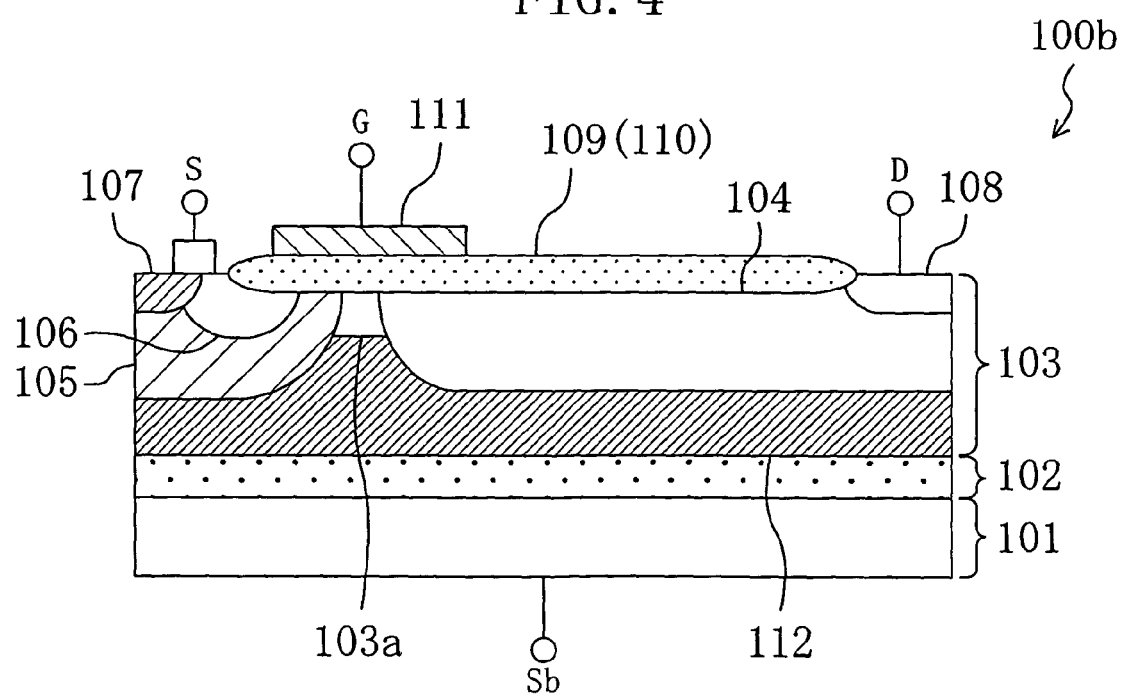

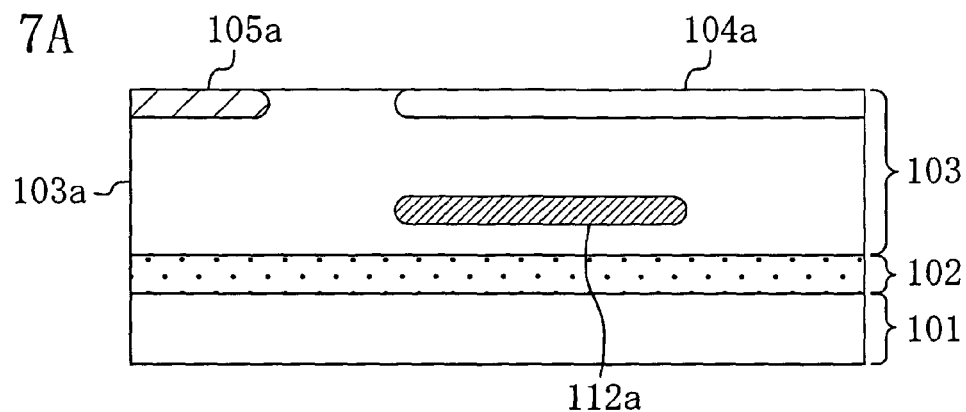
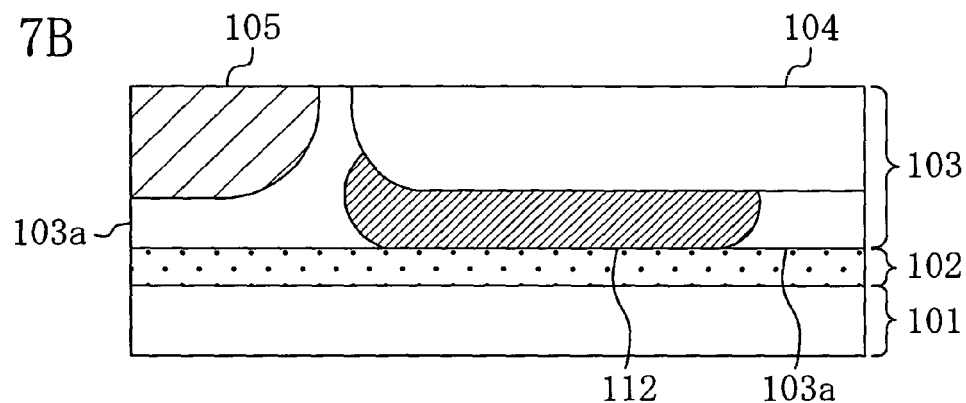
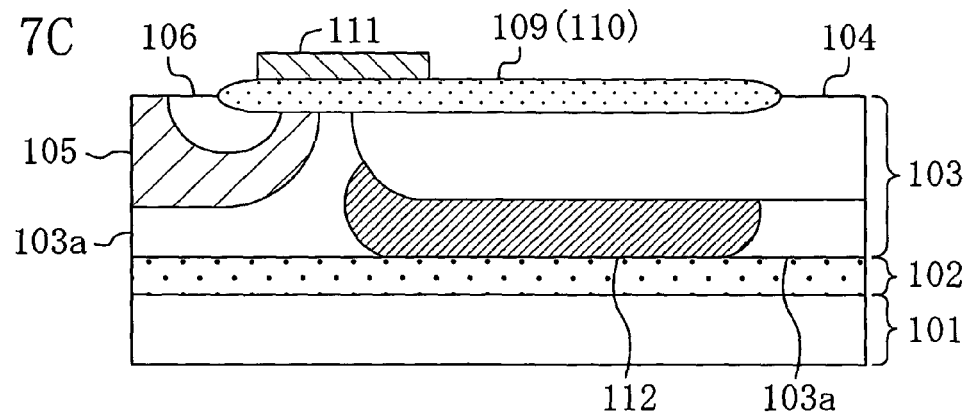
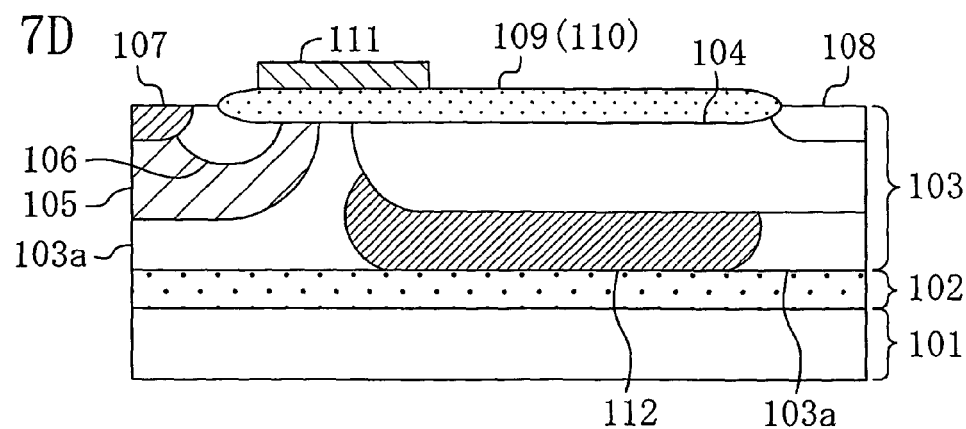

HIGH BREAKDOWN VOLTAGE SEMICONDUCTOR DEVICE AND FABRICATION METHOD OF THE SAME

CROSS REFERENCE TO RELATED APPLICATIONS

This Non-provisional application claims priority under 35 U.S.C. §119(a) on Patent Application No. 2005-098896 filed in Japan on Mar. 30, 2005, the entire contents of which are hereby incorporated by reference.

BACKGROUND OF THE INVENTION

1. Field of the Invention

The present invention relates to a high breakdown voltage semiconductor device and a fabrication method thereof. More particularly, the present invention relates to a high breakdown voltage MOS (Metal Oxide Semiconductor) transistor which achieves a high breakdown voltage while particularly suppressing an increase in on-resistance to the extent possible.

2. Description of the Related Art

For isolation of elements on a semiconductor device, a junction isolation technique using pn junction has been conventionally commonly used. However, in recent years, dielectric isolation has been used which is a technique of forming a trench in an SOI (Silicon On Insulator) substrate having a buried insulating film, the trench reaching from an SOI substrate surface to the buried insulating film, and forming an insulating film inside the trench.

Such SOI-trench isolation is particularly effective for high breakdown voltage power type semiconductor devices, which generally require formation of deep isolation. This is because, in the high breakdown voltage power type semiconductor, although the area of an isolation region disadvantageously becomes large when the pn junction isolation is used, use of the SOI-trench isolation makes it possible to reduce the area of the isolation region. As a result, it is possible to miniaturize a chip. In addition, advantageously, crosstalk between elements is eliminated, so that a plurality of high breakdown voltage power elements (output section) and a plurality of low breakdown voltage elements (drive circuit portion for the output section) can be readily formed on the same chip.

Due to advantages as described above, the high breakdown voltage power element formed on an SOI substrate has attracted attention.

In general, the performance of the high breakdown voltage power element is indicated by the breakdown voltage and the on-resistance. However, there is typically a trade-off therebetween, i.e., it is difficult to simultaneously achieve a high breakdown voltage and a low on-resistance. Therefore, attempts have been made for many years to do so. Particularly, in recent years, a high breakdown voltage power semiconductor product employing an SOI substrate has been mass-produced, and a high-breakdown voltage and low-on-resistance high breakdown voltage power element formed on an SOI substrate has been vigorously developed.

An exemplary conventional high breakdown voltage MOS transistor is illustrated in FIG. 10. This is a technique described in JP 2004-096083 A (particularly, claim 1 and FIG. 1), particularly relating to a high breakdown voltage P-channel MOS transistor. A practical example of such a high breakdown voltage P-channel MOS transistor is a driver IC for a PDP (plasma display panel) illustrated in FIG. 11. HP1 to HP3 of FIG. 11 each correspond to the high breakdown voltage P-channel MOS transistor of FIG. 10. This IC is characterized in that a high voltage (VDDH: one hundred and several tens of voltages) is applied to a gate of the high breakdown voltage P-channel MOS transistor. Therefore, it is necessary to increase a gate oxide film thickness so as to secure a sufficient dielectric breakdown voltage. Therefore, the structure of FIG. 10 also employs a thick gate oxide film.

Hereinafter, as one example of the conventional high breakdown voltage semiconductor device of FIG. 10, a high breakdown voltage P-channel MOS transistor will be described.

This P-channel MOS transistor includes an SOI substrate composed of an N- or P-type support substrate 11, a buried oxide film 12, and an N-type active layer 13, as illustrated in FIG. 10.

A P-type drain offset region 14 is formed on the N-type active layer 13 of the SOI substrate, and an N-type well region 15 is formed on the same N-type active layer 13 and at a location two-dimensionally apart from the P-type drain offset region 14.

A P-type source region 16 and an N-type body contact region 17 are formed on the N-type well region 15. Further, a P-type drain region 18 is formed on the P-type drain offset region 14.

A LOCOS oxide film 19 is formed on at least the P-type drain offset region 14, the N-type well region 15, a region of the N-type active layer 13 interposed between the P-type drain offset region 14 and the N-type well region 15, and the like.

A gate electrode 21 is formed via a thick gate oxide film 20 on the N-type well region 15. Note that the LOCOS oxide film 19 can double as the thick gate oxide film 20, and such a structure is illustrated in FIG. 10.

A source electrode is connected onto the P-type source region 16 and the N-type body contact region 17, and a drain electrode is connected onto the P-type drain region 18. A substrate electrode is connected to the N- or P-type substrate 11.

In order to measure an off breakdown voltage of such a P-channel MOS transistor, a negative potential is applied to the drain electrode and the substrate electrode while setting the source electrode and the gate electrode to be GND.

When an inverse bias voltage is applied between the drain and the source in this manner, the P-type drain offset region 14 and a portion of the N-type active layer 13 under the P-type drain offset region 14 are depleted. The voltage applied between the drain and the source is held by a depletion layer thus formed.

When the voltage applied between the drain and the source is increased to a certain voltage at which a field formed in the depletion layer reaches a critical field, avalanche breakdown suddenly occurs, so that a current starts flowing between the drain and the source. The voltage applied in this case is the breakdown voltage value of a transistor. Therefore, in order to increase the breakdown voltage, it is necessary to adjust an impurity concentration of the P-type drain offset region 14 (hereinafter, the term "concentration" may be used interchangeably with the term "impurity concentration") so that the depletion layer sufficiently becomes spread, thereby relaxing a field intensity.

SUMMARY OF THE INVENTION

However, the structure of the conventional high breakdown voltage P-channel MOS transistor has the following drawbacks.

According to the structure of the conventional high breakdown voltage P-channel MOS transistor, the P-type drain offset region 14 is formed in the N-type active layer 13. Here, basically, the P-type drain offset region 14 has a concentration which is optimized so as to sufficiently deplete the P-type drain offset region 14 so that a high breakdown voltage is secured. In general, the optimization is performed so that the RESURF (reduced surface field) effect is sufficiently exhibited.

However, when the concentration of the P-type drain offset region 14 is optimized so as to secure a high breakdown voltage, an on-resistance may increase. This is because the P-type drain offset region 14 is a region through which an on-current actually flows, and the concentration of this region is directly involved with the on-resistance.

In order to reduce the on-resistance, a higher impurity concentration of the P-type drain offset region 14 is more advantageous. However, in order to improve the breakdown voltage, a high concentration of the P-type drain offset region 14 is not advantageous. In general, there is a trade-off between a high breakdown voltage and a low on-resistance. Specifically, when the concentration of the P-type drain offset region 14 is decreased, the breakdown voltage tends to be improved, though the on-resistance is disadvantageously increased. Conversely, when the concentration of the P-type drain offset region 14 is increased, whereas the breakdown voltage tends to decrease, the on-resistance is advantageously reduced.

According to the above-described relationship, when an importance is put on a high breakdown voltage (i.e., the concentration of the P-type drain offset region 14 is reduced), the on-resistance is sacrificed, i.e., increases.

In view of the above-described problems, the present invention provides a semiconductor device comprising a high breakdown voltage MOS transistor which achieves a high breakdown voltage while considerably suppressing an increase in on-resistance, and a fabrication method thereof.

According to the present invention, a high breakdown voltage semiconductor device formed using an SOI substrate comprising a support substrate, an insulating film formed on the support substrate, and an active layer formed on the insulating film, comprises a first conductive type well region formed on the active layer, a second conductive type drain offset region formed on the active layer and apart from the well region, a second conductive type source region formed on the well region, a second conductive type drain region formed on the drain offset region, a gate insulating film formed in at least a region interposed between the source region and the drain offset region of the active layer, and a gate electrode formed on the gate insulating film. The device further comprises a first conductive type deep well region formed under the drain offset region of the active layer. A concentration peak of a first conductive type impurity introduced for formation of the deep well region is located deeper than a concentration peak of a second conductive type impurity introduced for formation of the drain offset region.

According to the high breakdown voltage semiconductor device of the present invention, the first conductive type deep well region is provided under the second conductive type drain offset region, and the concentration peak of the deep well region-forming impurity is located deeper than the concentration peak of the drain offset region-forming impurity. Therefore, a breakdown voltage can be improved while suppressing an increase in an on-resistance. The reason will be hereinafter described.

Note that the drain offset region-forming impurity is the second conductive type impurity introduced for formation of the drain offset region, and the deep well region-forming impurity is the first conductive type impurity introduced for formation of the deep well region. The concentration peak refers to a peak in a concentration profile of the introduced impurity.

The breakdown voltage of the high breakdown voltage semiconductor device of the present invention is basically determined based on the concentrations of the drain offset region and the deep well region thereunder (the concentrations of impurities introduced for formation of the respective regions), as is similar to that the breakdown voltage of the conventional high breakdown voltage semiconductor device is determined based on the concentrations of the drain offset region and the active layer portion thereunder. More specifically, pn junction is present at an interface between the drain offset region and the deep well region having different conductive types. Therefore, the breakdown voltage is secured by optimizing the concentrations of the drain offset region and the deep well region so that a sufficient depletion layer is formed by the pn junction.

On the other hand, the on-resistance depends on the concentration of the drain offset region through which an on-current flows. The on-resistance increases with a decrease in the concentration of the drain offset region. When the concentration of the impurity for formation of the deep well region is high, since such impurity is distributed with a spread with respect to the drain offset region, the concentration of the drain offset region whose conductive type is different from that of the deep well region is canceled. In such a case, the on-resistance similarly increases.

In the case of the conventional high breakdown voltage semiconductor device, a drain offset region is formed with respect to an active layer having a uniform impurity concentration distribution. Therefore, by increasing the impurity concentration of the active layer, it is possible to generate depletion due to pn junction. However, in such a case, the concentration of the drain offset region is canceled and lowered, resulting in an increase in the on-resistance.

However, according to the high breakdown voltage semiconductor device of the present invention, the concentration peak of the deep well region forming impurity is located below (deeper than) the concentration peak of the drain offset region forming impurity. Therefore, the concentration of the deep well region forming impurity is distributed and decreased toward the vicinity of the surface of the active layer, so that cancellation of the concentration of the drain offset region is suppressed. In other words, a substantial reduction in the concentration of the drain offset region due to the formation of the deep well region is more relaxed than when the concentration peak of the deep well region forming impurity is present at a shallow location. Similarly, the above-described reduction in the concentration is more relaxed than when the drain offset region is formed with respect to the active layer having a uniform impurity concentration as in the conventional technique. Therefore, an increase in the on-resistance is suppressed.

As described above, the deep well region having a conductivity type opposite to that of the drain offset region is formed and buried under the drain offset region, so that a depletion layer caused by pn junction is utilized to increase the breakdown voltage. In addition to this, the concentration peak of the deep well region forming impurity is located below the concentration peak of the drain offset region forming impurity, thereby suppressing the concentration of the drain offset region from being canceled by the opposite conductivity type impurity. Therefore, an increase in resistance of the drain offset region is suppressed. As a result, an increase in the on-resistance of the high breakdown voltage semiconductor device is suppressed.

Thus, according to the high breakdown voltage semiconductor device of the present invention, the breakdown voltage can be improved while suppressing an increase in the on-resistance.

Note that the concentration peak of the deep well region forming impurity is preferably located deeper than the interface between the drain offset region and the deep well region.

In this case, the concentration of the deep well region forming impurity has a peak at a deeper location, and therefore, becomes lower in the vicinity of the active layer surface. In other words, even if the same amount of the drain offset region forming impurity is introduced, the concentration is lower in a surface portion of the active layer. Therefore, the concentration of the drain offset region is further canceled, so that the increase of the on-resistance is further certainly suppressed.

When the drain region is formed inside the drain offset region so that the drain region is not in contact with the deep well region, the breakdown voltage of the high breakdown voltage semiconductor device can be caused not to depend on the concentration of the drain region.

A parasitic capacitance occurring between the drain region and the support substrate is a combination capacitance of a first parasitic capacitance of the buried oxide film and a second parasitic capacitance of pn junction between the drain offset region and the deep well region. Therefore, due to the second parasitic capacitance caused by the deep well region being formed under the drain region as well, the parasitic capacitance occurring between the drain region and the support substrate is reduced, thereby achieving the effect of improving frequency characteristics of the transistor.

The deep well region is preferably formed under the drain offset region, excluding under the drain region.

In this case, it is possible to suppress punch through from occurring between the insulating film and the drain region included in the SOI substrate, under the drain region. As a result, it is possible to suppress the breakdown voltage of the high breakdown voltage semiconductor device from being lowered due to punch through occurring under the drain region. This will be hereinafter described.

When a voltage is applied to the high breakdown voltage semiconductor device, a depletion layer occurs under the drain region. When the depletion layer reaches the drain region, punch through occurs between the drain region and the insulating film. In such a case, the breakdown voltage of the high breakdown voltage semiconductor device is determined by a breakdown voltage with respect to punch through, leading to a reduction in the breakdown voltage.

Here, in the high breakdown voltage semiconductor device of the present invention, when the deep well region is formed under the drain region as well, a depletion layer is caused by pn junction present at the interface between the deep well region and the drain offset region, so that the punch through is likely to occur.

In contrast to this, the deep well region is formed under the drain offset region, excluding under the drain region. In other words, the deep well region is formed under the drain offset region, but is not formed in a region under the drain region. In this case, the pn junction caused by the presence of the deep well region does not occur under the drain region, so that punch through is unlikely to occur.

As a result, the breakdown voltage of the high breakdown voltage semiconductor device is improved by forming the deep well region under the drain offset region. In addition to this, it is possible to avoid the breakdown voltage of the high breakdown voltage semiconductor device from being determined by a breakdown voltage with respect to punch through so that the breakdown voltage is reduced due to this.

Preferably, the deep well region is formed under at least the drain offset region and the well region, and the concentration peak of the first conductive type impurity introduced for formation of the deep well region is located deeper than a concentration peak of the first conductive type impurity for formation of the well region.

Here, the first conductive type impurity introduced for formation of the well region is hereinafter referred to as a well region forming impurity.

In this case, under the source region, it is possible to suppress punch through from occurring between the insulating film and the source region included in the SOI substrate. As a result, it is possible to prevent the breakdown voltage of the high breakdown voltage semiconductor device from being reduced due to punch through occurring under the source region. This will be hereinafter described.

When a voltage is applied to the high breakdown voltage semiconductor device, a depletion layer may occur under the source region as well, so that punch through may occur between the source region and the insulating film, as described above concerning the drain region.

In contrast to this, when a deep well region of the same first conductive type as that of the well region is formed under the well region, the concentration of the first conductive type impurity increases between the source region and the insulating film, thereby making it possible to suppress depletion. Therefore, punch through is suppressed from occurring between the source region and the insulating film, thereby making it possible to avoid the breakdown voltage of the high breakdown voltage semiconductor device from being determined by a breakdown voltage with respect to such punch through.

As a result, the breakdown voltage of the high breakdown voltage semiconductor device is improved by forming the deep well region under the drain offset region. In addition to this, it is possible to avoid the breakdown voltage of the high breakdown voltage semiconductor device from being determined by a breakdown voltage with respect to punch through so that the breakdown voltage is reduced due to this.

Here, the concentration peak of the deep well region forming impurity is located deeper than the concentration peak of the well region forming impurity, thereby making it possible to achieve the effect of the deep well region, such as prevention of punch through and the like, without an influence on the concentration in the vicinity of the well region surface.

Preferably, the deep well region is formed under at least the drain offset region and the well region, excluding under the drain region, and the concentration peak of the first conductive type impurity introduced for formation of the deep well region is located deeper than a concentration peak of the first conductive type impurity for formation of the well region.

In this case, as described above, it is possible to suppress occurrence of punch through both between the drain region and the insulating film and between the source region and the insulating film. Therefore, it is possible to avoid the breakdown voltage of the high breakdown voltage semiconductor device from being determined and reduced by a breakdown voltage with respect to punch through. Such an effect is achieved in addition to the improvement of the breakdown voltage due to the formation of the deep well region under the drain offset region, so that the breakdown voltage of the high breakdown voltage semiconductor device is further certainly improved.

As described above, according to the high breakdown voltage semiconductor device of the present invention, the breakdown voltage can be improved while suppressing an increase in the on-resistance.

Next, according to the present invention, a method of fabricating a high breakdown voltage semiconductor device formed using an SOI substrate comprising a support substrate, an insulating film formed on the support substrate, and an active layer formed on the insulating film, comprises the steps of forming a first conductive type well region on the active layer, forming a second conductive type drain offset region on the active layer and apart from the well region, forming a second conductive type source region on the well region, forming a second conductive type drain region on the drain offset region, forming a gate insulating film in at least a region interposed between the source region and the drain offset region of the active layer, and forming an electrode on the gate insulating film. The method further comprises forming a first conductive type deep well region by implanting first conductive type impurity with high energy, under the drain offset region of the active layer, and a concentration peak of the first conductive type impurity introduced for formation of the deep well region is located deeper than a concentration peak of a second conductive type impurity introduced for formation of the drain offset region.

According to the fabrication method of the high breakdown voltage semiconductor device of the present invention, by introducing the first conductive type impurity into the active layer with high energy implantation, it is possible to form the deep well region having a concentration peak located at a predetermined depth from a surface of the active layer. In addition, by appropriately selecting the implantation energy, it is possible to adjust the depth of the concentration peak from the active layer surface, and set the concentration peak of the deep well region forming impurity to be lower than the concentration peak of the drain offset region forming impurity. In this case, the deep well region forming impurity has a concentration profile such that the impurity concentration decreases from the concentration peak depth toward the active layer surface.

Thus, it is possible to fabricate the high breakdown voltage semiconductor device of the present invention having a deep well region which is buried inside an active layer. Such a high breakdown voltage semiconductor device has an improved breakdown voltage while suppressing an increase in the on-resistance.

According to the present invention, a high breakdown voltage semiconductor device has a first conductive type deep well region which has a concentration peak located deeper than a concentration peak of an impurity for formation of a second conductive type drain offset region, thereby making it possible to improve a breakdown voltage while suppressing an increase in an on-resistance. Therefore, the present invention is useful as a high breakdown voltage semiconductor device, and particularly, can be effectively utilized as, for example, a high breakdown voltage MOS transistor used for a driver IC for a plasma display.

BRIEF DESCRIPTION OF THE DRAWINGS

FIG. 3 is a schematic cross-sectional view of a high breakdown voltage MOS transistor according to a second embodiment of the present invention.

FIG. 4 is a schematic cross-sectional view of a high breakdown voltage MOS transistor according to a third embodiment of the present invention.

FIGS. 7A to 7D are diagrams for explaining a fabrication process of the high breakdown voltage MOS transistor of the second embodiment of the present invention, as a sixth embodiment.

DESCRIPTION OF THE PREFERRED EMBODIMENTS

Hereinafter, semiconductor devices according to embodiments of the present invention will be described with reference to the accompanying drawings. Although the terms "first conductive type" and "second conductive type" as used herein refer to "N type" and "P type", respectively, the terms "first conductive type" and "second conductive type" may conversely refer to "P type" and "N type", respectively.

First Embodiment

Figure 1:
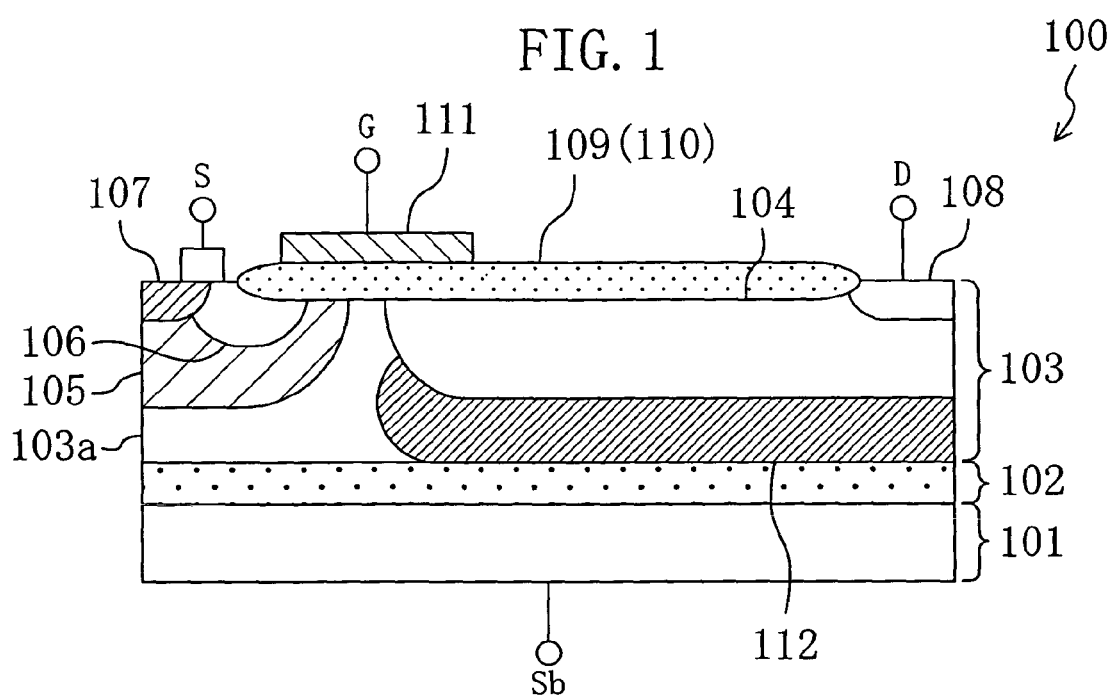
FIG. 1 is a schematic cross-sectional view of a high breakdown voltage MOS transistor according to a first embodiment of the present invention.

FIG. 1 is a cross-sectional view of a high breakdown voltage P-channel MOS transistor 100 (hereinafter denoted as a high breakdown voltage PMOS FET 100) as a high breakdown voltage semiconductor device according to the first embodiment. The high breakdown voltage PMOS FET 100 comprises an SOI substrate composed of a support substrate 101, a buried oxide film 102 formed on the support substrate 101, and a P-type active layer 103 formed on the buried oxide film 102. Note that it is herein assumed that the P-type active layer 103 is a region as a component of the SOI substrate as illustrated in FIG. 1. Specifically, the P-type active layer 103 includes various regions formed by introduction of impurities (a P-type drain offset region 104, an N-type well region 105, etc.). In contrast to this, a region of the P-type active layer 103 in which the other regions are not formed is referred to as a P-type region 103a. Thus, the P-type region 103a is a remaining portion of the P-type active layer 103.

The high breakdown voltage PMOS FET 100 is formed in regions sectioned by, for example, SOI-trench isolation (not shown).

In FIG. 1, the P-type drain offset region 104 is formed on the P-type active layer 103. In addition, the N-type well region 105 is formed on the same P-type active layer 103 and two-dimensionally apart from the P-type drain offset region 104.

A P-type source region 106 and an N-type body contact region 107 are formed on the N-type well region 105. Further, a P-type drain region 108 is formed on the P-type drain offset region 104.

A LOCOS oxide film 109 is formed on at least a region of the P-type active layer 103 which is interposed between the P-type drain offset region 104 and the N-type well region 105.

A gate electrode 111 is formed via a thick gate oxide film 110 on at least the N-type well region 105. Here, the LOCOS oxide film 109 can double as the thick gate oxide film 110, and such a structure is illustrated in FIG. 1. However, the thick gate oxide film 110 may be provided as a component different from the LOCOS oxide film 109. In this case, the thick gate oxide film 110 is formed on at least a region interposed between a P-type source region 108 and the P-type drain offset region 104 on a surface of the P-type active layer 103.

A source electrode S is formed with respect to the P-type source region 106 and the N-type body contact region 107, and a drain electrode D is formed with respect to the P-type drain region 108. A substrate electrode Sb is connected to the support substrate 101. Note that, concerning the source electrode S, the drain electrode D, and the substrate electrode Sb, only electrical connections thereof are illustrated, but not structures thereof. In addition, an electrical connection G is illustrated with respect to the gate electrode 111.

An N-type deep well region 112 is formed under the P-type drain offset region 104 including under the P-type drain region 108.

In the above-described structure, a P-type impurity introduced for formation of the P-type drain offset region 104 (hereinafter referred to as a P-type drain offset region 104-forming impurity) has a concentration peak located in the vicinity of a surface of the P-type active layer 103. An N-type impurity introduced for formation of the N-type deep well region 112 (hereinafter referred to as an N-type deep well region 112-forming impurity) has a concentration profile in which a concentration peak is located sufficiently deeper than the concentration peak of the P-type drain offset region 104-forming impurity, and a concentration decreases toward the surface of the P-type active layer 103. Therefore, the high breakdown voltage PMOS FET 100 of this embodiment improves a breakdown voltage while suppressing an increase in an on-resistance. This will be hereinafter described.

Figure 10:
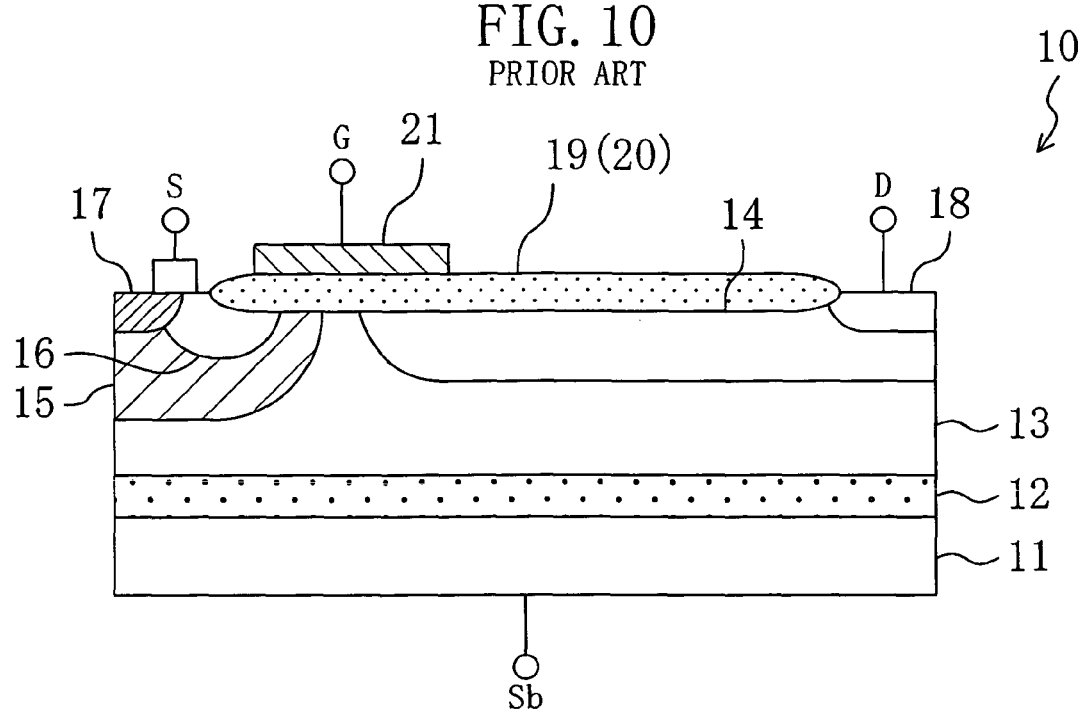
FIG. 10 is a schematic cross-sectional view of a conventional high breakdown voltage MOS transistor according to a fourth embodiment of the present invention.
Figure 11:
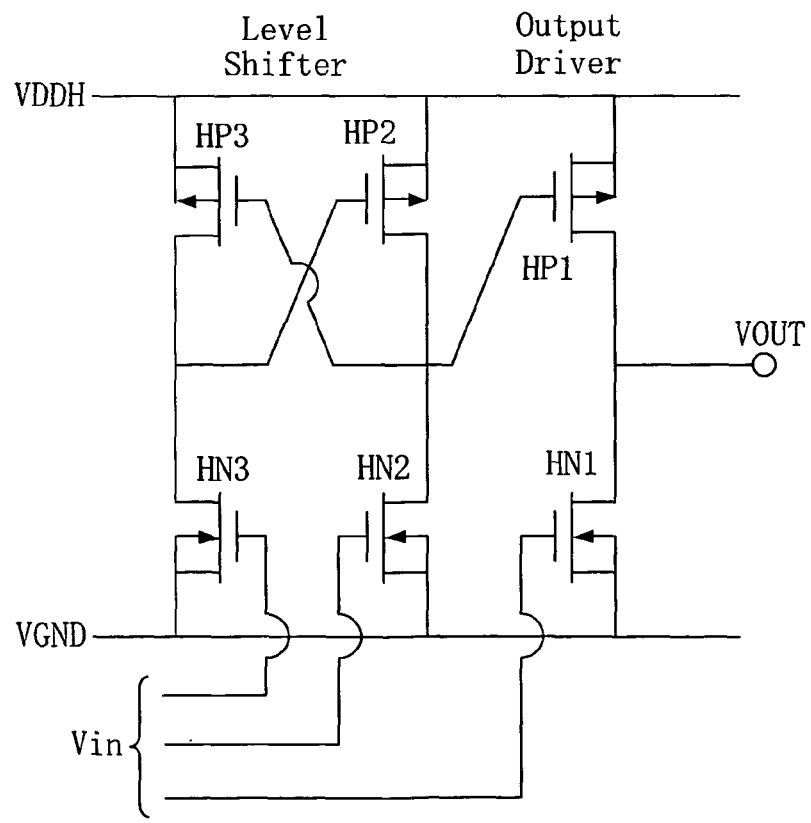
FIG. 11 is a diagram illustrating an exemplary circuit of a driver IC for a plasma display.

The breakdown voltage of the high breakdown voltage PMOS FET 100 of this embodiment is basically determined based on the concentrations of the P-type drain offset region 104 and the deep well region 112. This is similar to that the breakdown voltage of the conventional high breakdown voltage semiconductor device of FIG. 10 is basically determined based on the concentrations of the P-type drain offset region 14 and the portion of the active layer 13 thereunder.

The concentrations of the P-type drain offset region 104 and the N-type deep well region 112 are set so as to increase the breakdown voltage of the high breakdown voltage PMOS FET 100. Thereby, a sufficient depletion layer caused by pn junction present at an interface between the P-type drain offset region 104 and the N-type deep well region 112 is formed, thereby making it possible to increase the breakdown voltage.

On the other hand, the on-resistance of the high breakdown voltage PMOS FET 100 depends on the concentration of the P-type drain offset region 104, which is a region through which an on-current flows. When the concentration of the P-type drain offset region 104 is small, the on-resistance is large.

Also, when the spread of the N-type impurity for formation of the N-type deep well region 112 cancels the concentration of the P-type impurity introduced into the P-type drain offset region 104, the on-resistance is large.

However, in the high breakdown voltage PMOS FET 100, as described above, the concentration peak of the N-type deep well region 112-forming impurity is located deep from the surface of the P-type active layer 103. More specifically, the concentration peak of the N-type deep well region 112-forming impurity is located below the concentration peak of the P-type drain offset region 104-forming impurity. This situation is illustrated in FIG. 2.

Figure 2:
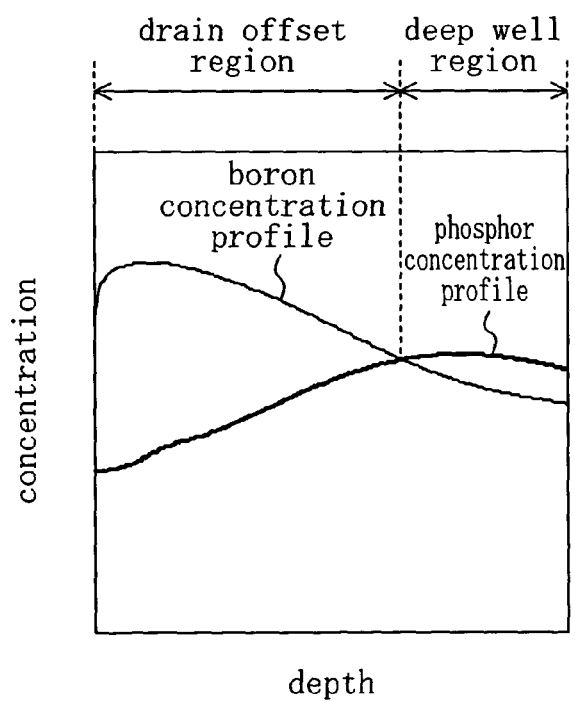
FIG. 2 is an image diagram indicating concentration profiles of a P-type drain offset region and an N-type deep well region in the high breakdown voltage MOS transistor of the first embodiment of the present invention.

FIG. 2 is an image diagram illustrating profiles indicating the concentrations of the P-type drain offset region 104 and the N-type deep well region 112 with respect to a depth from an interface between the LOCOS oxide film 109 and the P-type drain offset region 104. Here, boron is used for the formation of the P-type drain offset region 104, and phosphor is used for the formation of the N-type deep well region 112. The concentration on the vertical axis is indicated with a logarithmic scale.

As illustrated in FIG. 2, the phosphor concentration of the N-type deep well region 112 has a concentration peak located deeper than the concentration peak of the P-type drain offset region 104-forming impurity, and decreases toward the surface of the P-type active layer 103. Therefore, as compared to when the N-type impurity is introduced into the N-type deep well region 112 with a profile having a concentration peak in the vicinity of the surface of the P-type active layer 103, the concentration of boron for the formation of the P-type drain offset region 104 is suppressed from being canceled to be substantially decreased.

Due to the above-described concentration distribution, the breakdown voltage is increased by the formation of the N-type deep well region 112, and a reduction in the P-type impurity concentration of the P-type drain offset region 104 is suppressed, thereby suppressing an increase in the on-resistance. Such an effect is achieved even when the concentrations of the P-type drain offset region 104 and the N-type deep well region 112 are adjusted so that the breakdown voltage is maximized.

Here, in the high breakdown voltage PMOS FET 100 of this embodiment, for example, the concentration peak of the P-type drain offset region 104-forming impurity is located at a depth of 0.2 μm and has a value of $2.0 \times 10^{16}$ cm$^{-3}$. Also, for example, the concentration peak of the N-type deep well region 112-forming impurity is located at a depth of 2.2 μm and has a value of $5.0 \times 10^{15}$ cm$^{-3}$. Note that these are all for illustrative purposes, and the present invention is not limited to these.

Such a high breakdown voltage PMOS FET 100 is here compared in characteristics with the conventional high breakdown voltage semiconductor device without the N-type deep well region 112, for example, assuming that both the devices have a breakdown voltage of about 215 V. The on-resistance of the high breakdown voltage PMOS FET 100 of the present invention is suppressed to a maximum of about 80% with respect to the on-resistance of the conventional high breakdown voltage semiconductor device. Therefore, the high breakdown voltage PMOS FET 100 of the present invention can have a higher breakdown voltage while suppressing an increase in the on-resistance, as compared to the conventional high breakdown voltage semiconductor device. Note that the high breakdown voltage PMOS FET 100 of the present invention can have a further higher breakdown voltage as compared to the conventional high breakdown voltage semiconductor device, and also in this case, can suppress an increase in the on-resistance.

In the concentration profile of FIG. 2, the concentration peak of the N-type deep well region 112-forming impurity is located below the interface between the P-type drain offset region 104 and the N-type deep well region 112 (a point of intersection of the boron concentration profile and the phosphor concentration profile). In this case, the cancellation of the boron (P-type impurity) concentration of the P-type drain offset region 104 due to phosphor (N-type impurity) is further certainly suppressed. As a result, an effect of the high breakdown voltage PMOS FET 100 of this embodiment, i.e., an improvement in the breakdown voltage while suppressing an increase in the on-resistance, is significantly achieved, resulting in a preferable structure.

However, the present invention is not limited to this case. For example, the concentration peak of the deep well region 112-forming impurity may be located below the concentration peak of the P-type drain offset region 104-forming impurity and above the interface between the P-type drain offset region 104 and the N-type deep well region 112. Also in such a case, the effect of the high breakdown voltage PMOS FET 100 of this embodiment can be achieved.

In the high breakdown voltage PMOS FET 100 of this embodiment, as illustrated in FIG. 1, the P-type drain region 108 having a high concentration (e.g., $1.0 \times 10^{20}$ cm$^{-3}$) is formed inside the P-type drain offset region 104 having a low concentration (e.g., a peak concentration of $2.0 \times 10^{16}$ cm$^{-3}$) so that the P-type drain region 108 is not in contact with the N-type deep well region 112. Therefore, the breakdown voltage of the high breakdown voltage PMOS FET 100 does not depend on the concentration of the P-type drain region 108, and is determined based on the concentrations of the P-type drain offset region 104 and the N-type deep well region 112 as described above. Therefore, the degree of freedom of setting the concentration of the P-type drain region 108 is increased, and the breakdown voltage and the on-resistance can be optimized based on the concentrations of the P-type drain offset region 104 and the N-type deep well region 112.

A parasitic capacitance occurring between the drain region 108 and the support substrate 101 is a combination capacitance of the following two parasitic capacitances connected in series. Specifically, the parasitic capacitance is a combination capacitance of a first parasitic capacitance of the buried oxide film 102 and a second parasitic capacitance of pn junction between the P-type drain offset region 104 and the N-type deep well region 112. Therefore, the parasitic capacitance is reduced due to the second parasitic capacitance which is caused by the presence of the N-type deep well region 112, resulting in an improvement in frequency characteristics of the transistor. The formation of the N-type deep well region 112 below the P-type drain region 108 as well has such an effect.

Also, in the foregoing description of this embodiment, the P-type active layer 103 is an active layer included in the SOI substrate. Even when an N-type active layer is used instead of this, the effect of forming the N-type deep well region 112 can be obtained. When the active layer is of N type, pn junction is constructed at an interface between the active layer and the P-type drain offset region 104 even if the N-type deep well region 112 is not formed. However, since the N-type impurity concentration of the N-type deep well region 112 can be caused to be higher than the N-type impurity concentration of the active layer, the pn junction can be more effectively utilized to obtain a high breakdown voltage.

Second Embodiment

Hereinafter, a semiconductor device according to a second embodiment of the present invention will be described with reference to FIG. 3. FIG. 3 is a cross-sectional view of a structure of a high breakdown voltage PMOS FET 100a as the high breakdown voltage semiconductor device of this embodiment.

The high breakdown voltage PMOS FET 100a of FIG. 3 has a structure and components similar to those of the high breakdown voltage PMOS FET 100 of the first embodiment of FIG. 1, except for a location where the N-type deep well region 112 is formed. Therefore, in FIG. 3, the same components as those of FIG. 1 are indicated with the same reference numerals and will not be described. A difference therebetween will be described in detail.

In the high breakdown voltage PMOS FET 100 of FIG. 1, the N-type deep well region 112 is formed in a region under the P-type drain offset region 104 including under the P-type drain region 108. In contrast to this, in the high breakdown voltage PMOS FET 100a of this embodiment of FIG. 3, an N-type deep well region is formed in a region under the P-type drain offset region 104 excluding under the P-type drain region 108. This point is a difference from the first embodiment.

Here, the concentrations of the P-type drain offset region 104 and the N-type deep well region 112 are similar to those of the first embodiment.

With the above-described structure, as is similar to the first embodiment, the formation of the N-type deep well region 112 results in an improvement in the breakdown voltage, and the deep location of the concentration peak of the N-type deep well region 112-forming impurity suppresses an increase in the on-resistance.

In addition to this, since the N-type deep well region 112 is formed at a location excluding under the P-type drain region 108, punch through is suppressed between the buried oxide film 102 included in the SOI substrate, and the P-type drain region 108, thereby making it possible to suppress a reduction in the breakdown voltage which is caused by such punch through. This will be hereinafter described.

When a voltage is applied to the high breakdown voltage PMOS FET 100a, a depletion layer occurs under the P-type drain region 108. Such a depletion layer causes punch through between the P-type drain region 108 and the buried oxide film 102.

Here, when the N-type deep well region 112 is formed under the P-type drain region 108 as well, as in the high breakdown voltage PMOS FET 100 of the first embodiment, depletion occurs due to the pn junction constructed at the interface between the P-type drain offset region 104 and the N-type deep well region 112. Therefore, in the high breakdown voltage PMOS FET 100, punch through is likely to occur between the P-type drain region 108 and the buried oxide film 102, the breakdown voltage of the high breakdown voltage PMOS FET 100 itself is determined based on a breakdown voltage with respect to such punch through, possibly leading to a reduction in the breakdown voltage.

In contrast to this, in the case of the high breakdown voltage PMOS FET 100a of this embodiment, the N-type deep well region 112 is formed in the region under the P-type drain offset region 104 excluding under the P-type drain region 108. Specifically, since the N-type deep well region 112 is not formed under the P-type drain region 108, pn junction at the interface between the P-type drain offset region 104 and the N-type deep well region 112 is not present under the P-type drain region 108. As a result, the occurrence of punch through which is caused by depletion due to the pn junction is suppressed, thereby suppressing a reduction in the breakdown voltage of the high breakdown voltage PMOS FET 100a.

Note that, in the foregoing description of this embodiment, the active layer 103 included in the SOI substrate is of P type. Even when an N-type active layer is used instead of this, the effect of suppressing punch through between the P-type drain region 108 and the buried oxide film 102 is obtained. This is because the concentration of the N-type active layer is lower than the concentration of the N-type deep well region 112, and therefore, depletion due to the pn junction is reduced.

Third Embodiment

Hereinafter, a semiconductor device according to a third embodiment of the present invention will be described with reference to FIG. 4. FIG. 4 is a cross-sectional view of a structure of a high breakdown voltage PMOS FET 100b as the high breakdown voltage semiconductor device of this embodiment.

The high breakdown voltage PMOS FET 100b of FIG. 4 has a structure and components similar to those of the high breakdown voltage PMOS FET 100 of the first embodiment of FIG. 1, except for a location where the N-type deep well region 112 is formed. Therefore, in FIG. 4, the same components as those of FIG. 1 are indicated with the same reference numerals and will not be described. A difference therebetween will be described in detail.

In the high breakdown voltage PMOS FET 100 of FIG. 1, the N-type deep well region 112 is formed in a region under the P-type drain offset region 104 including under the P-type drain region 108. In contrast to this, in the high breakdown voltage PMOS FET 100b of this embodiment of FIG. 3, an N-type deep well region is formed in a region under the P-type drain offset region 104, and in addition, under the N-type well region 105. Further, the N-type deep well region 112 is also formed in the active layer 103 interposed between the P-type drain offset region 104 and the N-type well region 105. As a result, the N-type deep well region 112 is formed at a deep location in the P-type active layer 103, extending throughout the high breakdown voltage PMOS FET 100b. This point is a difference from the first embodiment.

Here, the concentrations of the P-type drain offset region 104 and the N-type deep well region 112 are similar to those of the first embodiment. The concentration peak of the N-type deep well region 112-forming impurity is located sufficiently deeper than a concentration peak of an N-type impurity introduced for formation of the N-type well region 105 (hereinafter referred to as an N-type well region 105-forming impurity).

With the above-described structure, as is similar to the first embodiment, the formation of the N-type deep well region 112 results in an improvement in the breakdown voltage, and the deep location of the concentration peak of the N-type deep well region 112-forming impurity suppresses an increase in the on-resistance.

In addition to this, since the N-type deep well region 112 is formed under the N-type well region 105 as well, punch through is suppressed between the buried oxide film 102 included in the SOI substrate, and the P-type source region 106, thereby making it possible to suppress a reduction in a breakdown voltage which is caused by such punch through. This will be hereinafter described.

When a voltage is applied to the high breakdown voltage PMOS FET 100b, a depletion layer occurs under the P-type source region 106. Such a depletion layer causes punch through between the P-type source region 106 and the buried oxide film 102. The breakdown voltage of the high breakdown voltage PMOS FET 100b itself is determined based on a breakdown voltage with respect to such punch through, possibly leading to a reduction in the breakdown voltage.

Here, when the N-type deep well region 112 is not formed under the N-type well region 105 as in the high breakdown voltage PMOS FET 100 of the first embodiment, pn junction occurs at an interface between the P-type region 103a and the N-type well region 105, thereby causing depletion. Such depletion is likely to cause punch through between the P-type source region 106 and the buried oxide film 102.

In contrast to this, when the N-type deep well region 112 is formed under the N-type well region 105 as well, since both of these two regions are of N type, and therefore, pn junction is not formed, so that depletion does not occur. Therefore, punch through is unlikely to occur between the P-type source region 106 and the buried oxide film 102.

Note that the concentration peak of the N-type deep well region 112-forming impurity is formed at a sufficiently deep location than the concentration peak of the N-type well region 105-forming impurity. Therefore, the above-described punch through between the N-type well region 105 and the buried oxide film 102 can be suppressed while suppressing a change in impurity concentration in the vicinity of a surface of the N-type well region 105 which is directly involved with a threshold voltage.

Note that, even when the active layer included in the SOI substrate is of N type which is different from that of the P-type active layer 103 of this embodiment, the effect of suppressing punch through is obtained. This is because the concentration of the N-type deep well region 112 is higher than the N-type impurity concentration of the active layer, and therefore, the N-type impurity concentration is increased between the P-type source region 106 and the buried oxide film 102, so that punch through is suppressed at this location.

Fourth Embodiment

Figure 5:
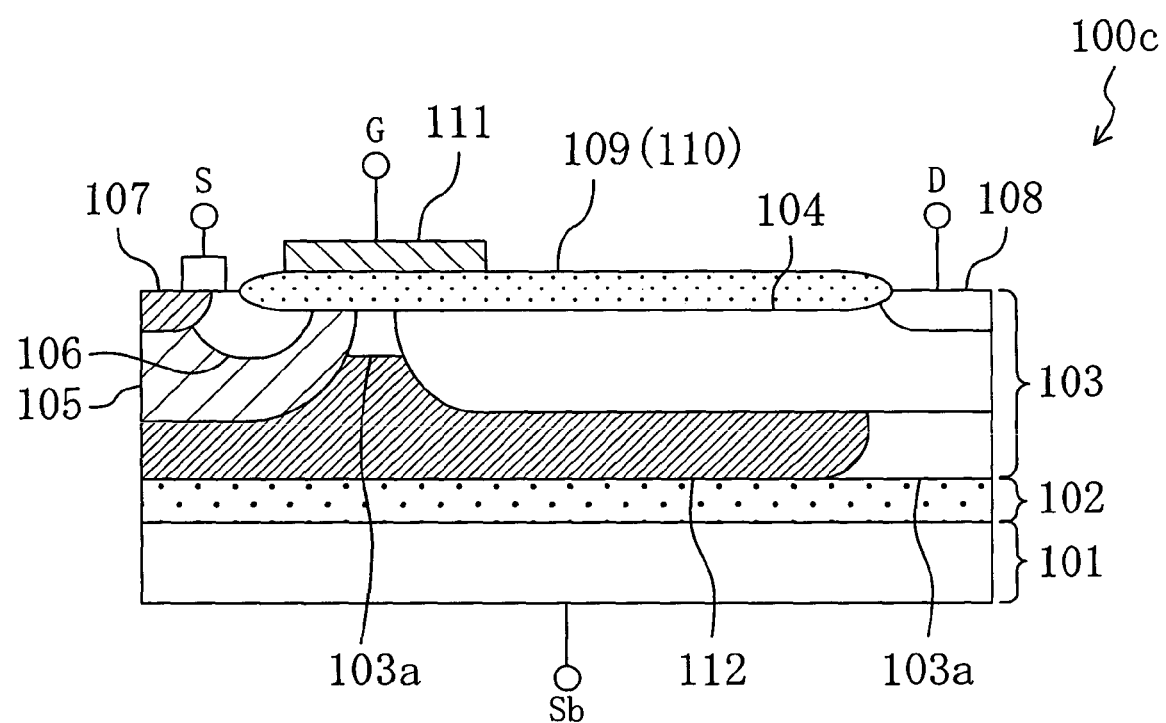
FIG. 5 is a schematic cross-sectional view of a high breakdown voltage MOS transistor according to a fourth embodiment of the present invention.

Hereinafter, a semiconductor device according to a fourth embodiment of the present invention will be described with reference to FIG. 5. FIG. 5 is a cross-sectional view of a structure of a high breakdown voltage PMOS FET 100c as the high breakdown voltage semiconductor device of this embodiment.

The high breakdown voltage PMOS FET 100c of FIG. 3 has a structure and components similar to those of the high breakdown voltage PMOS FET 100 of the first embodiment of FIG. 1, except for a location where the N-type deep well region 112 is formed. Therefore, in FIG. 5, the same components as those of FIG. 1 are indicated with the same reference numerals and will not be described. A difference therebetween will be described in detail.

In the high breakdown voltage PMOS FET 100 of FIG. 1, the N-type deep well region 112 is formed in a region under the P-type drain offset region 104 including under the P-type drain region 108. In contrast to this, in the high breakdown voltage PMOS FET 100c of this embodiment of FIG. 5, an N-type deep well region is formed under the P-type drain offset region 104 excluding under the P-type drain region 108, under the N-type well region 105, and in the active layer 103 interposed between the P-type drain offset region 104 and the N-type well region 105. As a result, the N-type deep well region 112 is formed at a deep location in the P-type active layer 103, extending throughout the high breakdown voltage PMOS FET 100c, excluding under the P-type drain region 108. This point is a difference from the first embodiment.

Here, the concentrations of the P-type drain offset region 104 and the N-type deep well region 112 are similar to those of the first embodiment. The concentration peak of the N-type deep well region 112-forming impurity is formed at a sufficiently deep location than the concentration peak of the N-type well region 105-forming impurity.

In addition to this, as in the second embodiment, the N-type deep well region 112 is not formed under the P-type drain region 108, and therefore, punch through is suppressed between the P-type drain region 108 and the buried oxide film 102. Also, as in the third embodiment, the N-type deep well region 112 is formed under the N-type well region 105 as well, and therefore, punch through is suppressed between the P-type source region 106 and the buried oxide film 102.

As described above, according to the high breakdown voltage PMOS FET 100c of this embodiment, it is possible to certainly suppress the breakdown voltage from being determined and reduced by punch through.

Although the P-type active layer 103 is used in this embodiment, an N-type active layer may be used instead of this. Also in this case, the effect of suppressing punch through is obtained as in the second and third embodiments.

Fifth Embodiment

Next, as a fifth embodiment, a method of fabricating the high breakdown voltage semiconductor device of the first embodiment will be described with reference to the drawings.

FIGS. 6A to 6D are diagrams for explaining a fabrication process of the high breakdown voltage PMOS FET 100 of the first embodiment of the present invention.

Figure 6A:
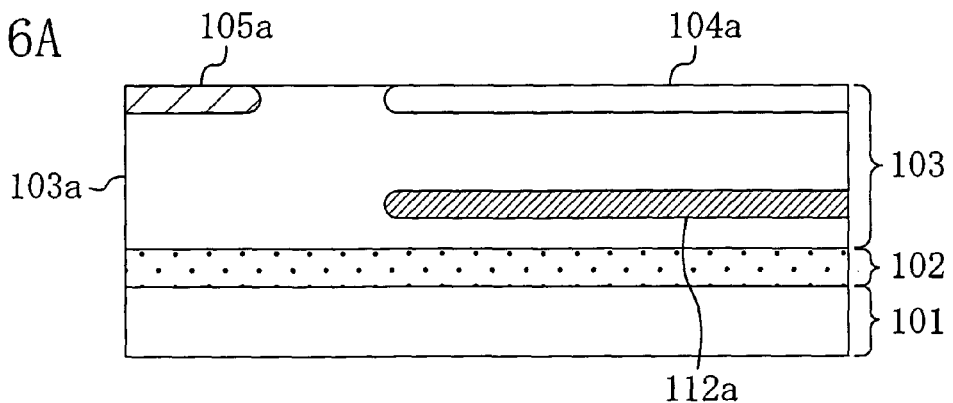
FIGS. 6A to 6D are diagrams for explaining a fabrication process of the high breakdown voltage MOS transistor of the first embodiment of the present invention, as a fifth embodiment.

As illustrated in FIG. 6A, the high breakdown voltage PMOS FET 100 is formed using the SOI substrate composed of the support substrate 101, the buried oxide film 102, and the P-type active layer 103. Note that, as described in the first embodiment, the P-type active layer 103 refers to a region as a component of the SOI substrate, and includes various regions formed therein by impurity introduction or the like. A region of the P-type active layer 103 in which the various regions are not formed is referred to as a P-type region 103a.

An N-type impurity is implanted with high energy into the P-type active layer 103 of the SOI substrate. Thereby, a high energy implantation N-type region 112a is formed and buried at a deep location at a distance from a surface of the P-type active layer 103. Here, for example, it is assumed that phosphor is used as the implanted N-type impurity, the implantation energy is 2.0 MeV or more and 2.5 MeV or less, and the implanted amount is $1.0 \times 10^{12}$ cm$^{-2}$ or more and $2.0 \times 10^{12}$ cm$^{-2}$ or less. A region in which impurity implantation is to be performed is defined by, for example, using a thick resist film appropriate for high energy implantation to perform patterning using a photoetching technique or the like so that an opening is provided in such a region.

Next, a P-type implantation region 104a is formed in a surface portion of the P-type active layer 103. To achieve this, for example, impurity implantation is performed, where the implantation energy is 40 keV or more and 180 keV or less and the implanted amount is $2.0 \times 10^{12}$ cm$^{-2}$ or more and $3.0 \times 10^{12}$ cm$^{-2}$ or less. In the high breakdown voltage PMOS FET 100, the N-type deep well region 112 is supposed to be formed in a region under the P-type drain offset region 104. Therefore, the P-type implantation region 104a is formed on the high energy implantation N-type region 112a.

An N-type implantation region 105a is formed in a region at a distance from the P-type implantation region 104a in the surface portion of the P-type active layer 103 by, for example, phosphor implantation.

Figure 6B:
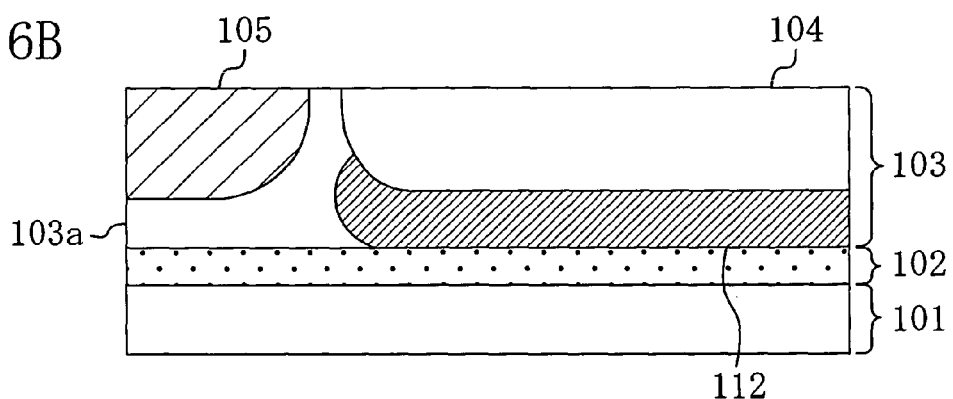

Next, as illustrated in FIG. 6B, the implanted impurity is diffused in the high energy implantation N-type region 112a, the P-type implantation region 104a, and the N-type implantation region 105a. Thereby, respectively, the N-type deep well region 112, the P-type drain offset region 104, and the N-type well region 105 are formed. To achieve this, for example, thermal diffusion is performed in nitrogen atmosphere (high temperature drive-in).

With such a process, the P-type drain offset region 104, the N-type deep well region 112, and the like each having an impurity concentration profile (peak location, peak concentration, etc.) as described in the first embodiment, can be obtained.

Figure 6C:
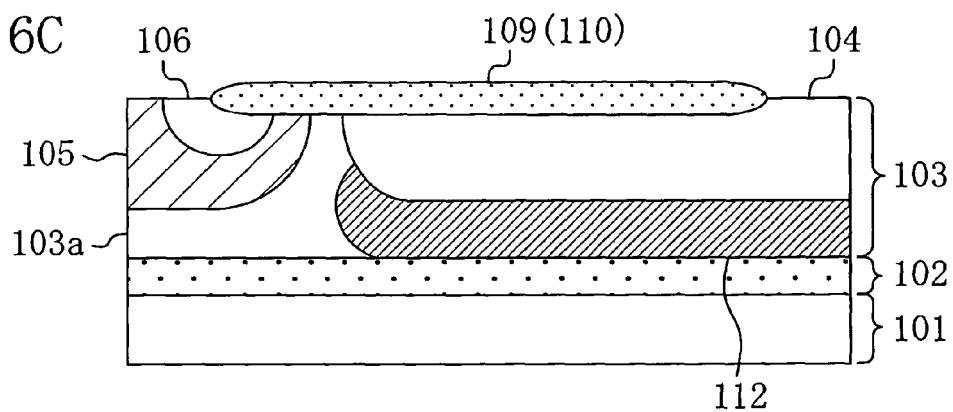

Next, as illustrated in FIG. 6C, the P-type source region 106 is formed by P-type impurity implantation or the like. Thereafter, the LOCOS oxide film 109 is formed in a partial region of the surface of the P-type active layer 103. Specifically, for example, the LOCOS oxide film 109 is formed on the P-type drain offset region 104 (excluding a region in which the P-type drain region 108 is formed later), a portion of each of the N-type well region 105 and the P-type source region 106, and a region of the P-type region 103a interposed between the N-type well region 105 and the P-type drain offset region 104.

Note that FIG. 6C illustrates the LOCOS oxide film 109 which doubles as the thick gate oxide film 110. However, a step of forming the thick gate oxide film 110 having a required thickness by a separate thermal treatment, may be provided. In this case, the thick gate oxide film 110 is formed on at least a region of the N-type well region 105 and the P-type region 103a interposed between the P-type source region 108 and the P-type drain offset region 104.

Figure 6D:
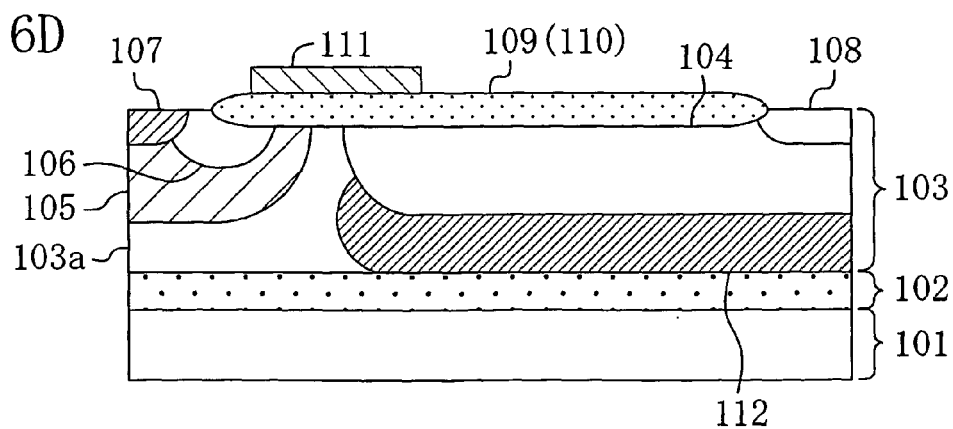

Next, as illustrated in FIG. 6D, a gate electrode 111 is formed on the thick gate oxide film 110. Specifically, for example, a polysilicon film doped with phosphor is formed using a CVD (Chemical Vapor Deposition) technique, a resist is patterned on the polysilicon film using a photoetching technique, and the polysilicon is processed by dry etching or the like.

Next, the P-type drain region 108 is formed by implantation of, for example, boron, and the N-type body contact region 107 is formed by implantation of, for example, phosphor or arsenide.

Next, an oxide film is formed on a surface using, for example, an atmospheric pressure CVD technique, and surface roughness is reduced by reflowing. Thereafter, the oxide film is subjected to contact etching on each of the gate electrode 111, the P-type source region 106, the N-type body contact region 107, and the P-type drain region 108, thereby forming an opening. Further, for example, an aluminum film is grown by sputtering, and thereafter, the aluminum film is patterned by photoetching and dry etching, thereby forming a metal electrode. Specifically, the metal electrode is formed so that the gate electrode 111, the P-type source region 106 and the N-type body contact region 107, and the P-type drain region 108 each have an external potential.

Sixth Embodiment

Next, as a sixth embodiment, a fabrication method of the high breakdown voltage semiconductor device of the second embodiment will be described with reference to the drawings.

FIGS. 7A and 7D are diagrams for explaining a fabrication process of the high breakdown voltage PMOS FET 100a of the second embodiment. This fabrication process is similar to that of the high breakdown voltage PMOS FET 100 of the first embodiment described with reference to FIGS. 6A and 6D, except for a location where the high energy implantation N-type region 112a is formed. Therefore, the similarity will not be described and a difference therebetween will be described.

When the high breakdown voltage PMOS FET 100a of the second embodiment is fabricated, the high energy implantation N-type region 112a is formed in a range which is narrower than that of FIG. 6A, as illustrated in FIG. 7A. Therefore, a thick resist which is used during high energy implantation needs to be patterned so that an opening is provided at a corresponding location.

The P-type implantation region 104a and the N-type implantation region 105a are formed at locations similar to those of FIG. 6A. As a result, the P-type implantation region 104a is formed at a location including above the high energy implantation N-type region 112a.

Thereafter, by thermal diffusion of the impurity, the N-type deep well region 112 is formed in a range which is narrower than in the case of FIG. 6B, as illustrated in FIG. 7B. Further, steps similar to those of the high breakdown voltage PMOS FET 100 are performed as illustrated in FIGS. 7C and 7D.

As described above, the high breakdown voltage PMOS FET 100a of FIG. 3 in which the N-type deep well region 112 is formed under the P-type drain offset region 104 excluding under the P-type drain region 108, is fabricated.

Seventh Embodiment

Next, as a seventh embodiment, a fabrication method of the high breakdown voltage semiconductor device of the third embodiment will be described with reference to the drawings.

Figure 8A:
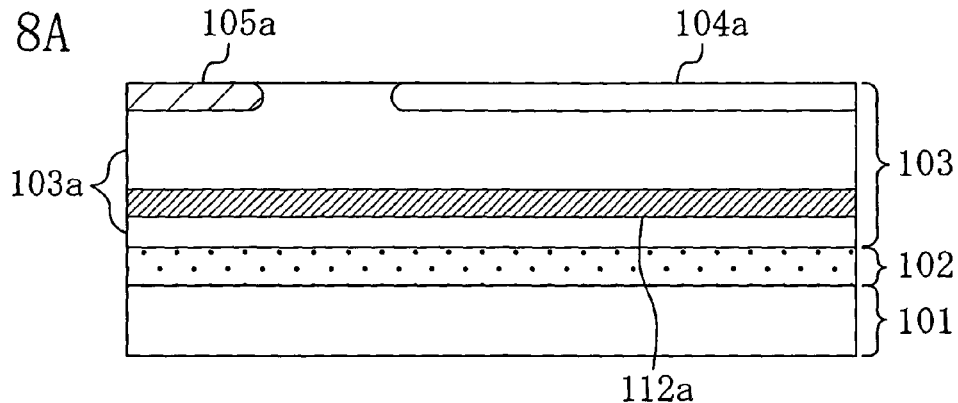
FIGS. 8A to 8D are diagrams for explaining a fabrication process of the high breakdown voltage MOS transistor of the third embodiment of the present invention, as a seventh embodiment.
Figure 8B:
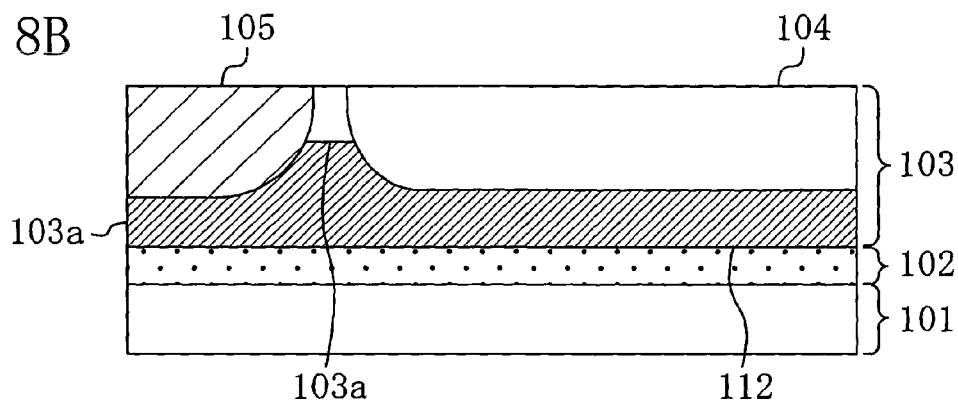
Figure 8C:
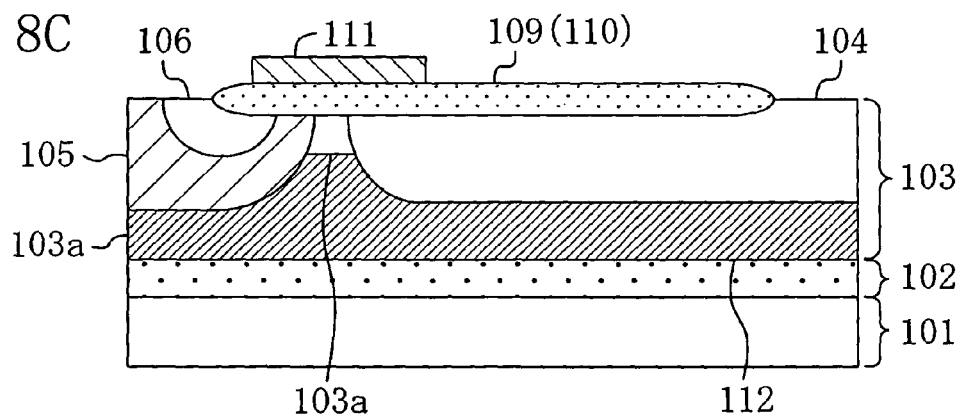
Figure 8D:
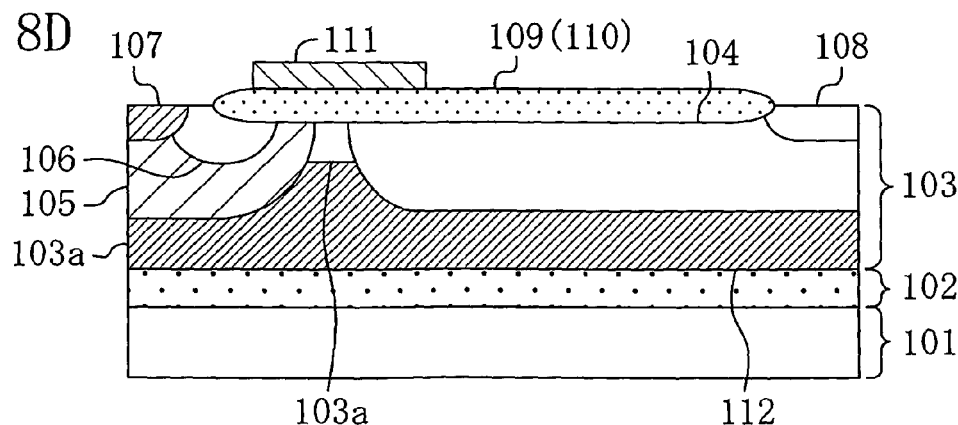
Figure 9A:
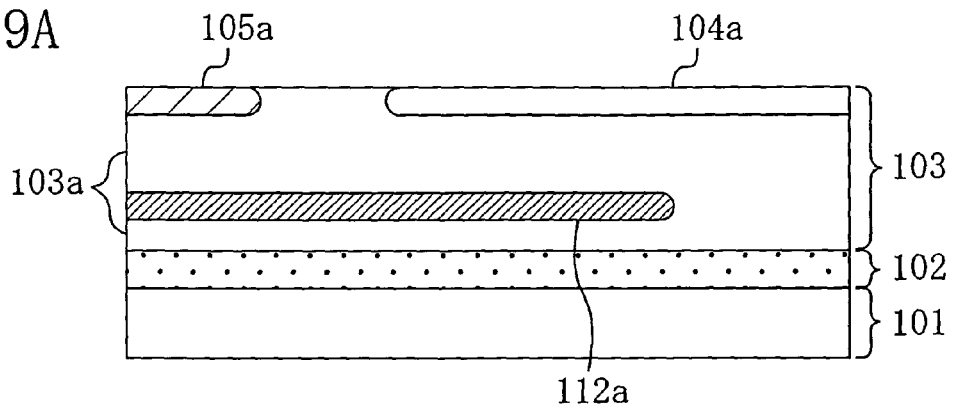
FIGS. 9A to 9D are diagrams for explaining a fabrication process of the high breakdown voltage MOS transistor of the fourth embodiment of the present invention, as a eighth embodiment.
Figure 9B:
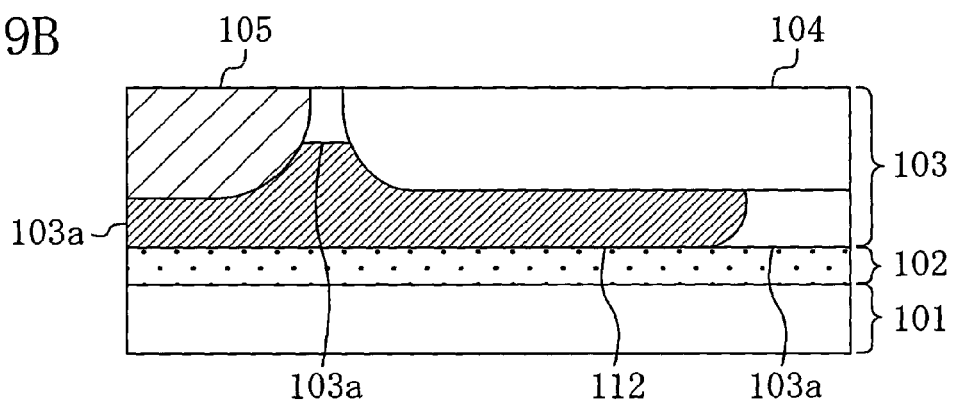
Figure 9C:
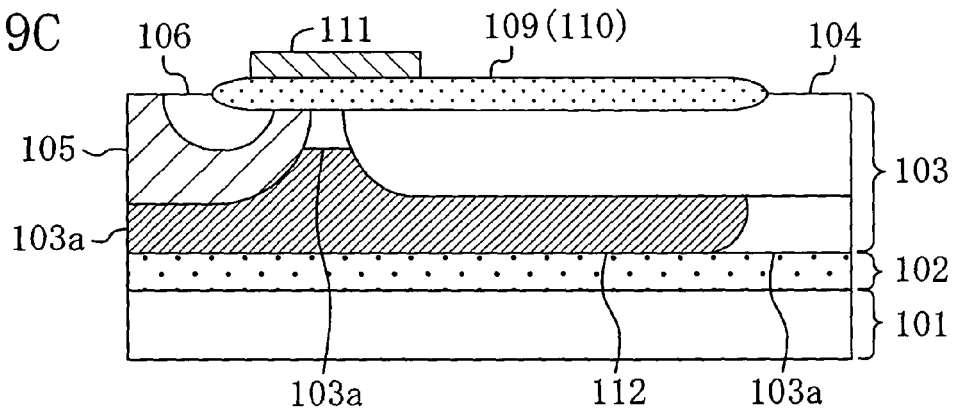
Figure 9D:
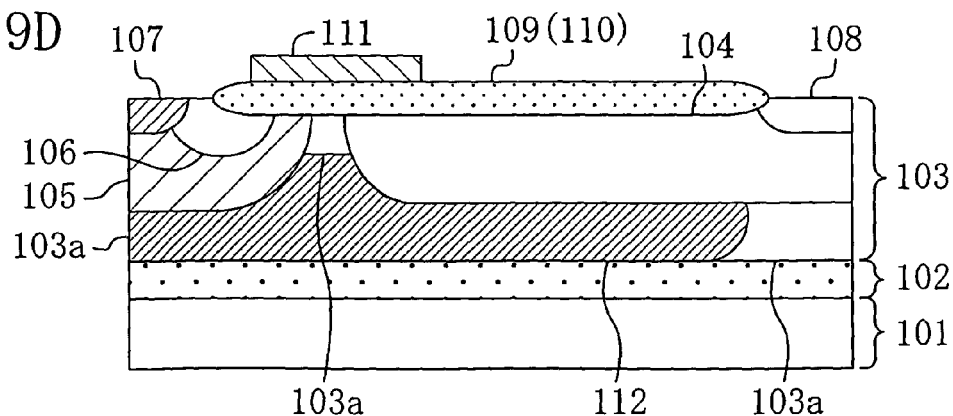

FIGS. 8A to 8D are diagrams for explaining a fabrication process of the high breakdown voltage PMOS FET 100b of the third embodiment. This fabrication process is also similar to that of the above-described high breakdown voltage PMOS FET 100 of the first embodiment and the like, except for a location where the high energy implantation N-type region 112a is formed. Specifically, the N-type deep well region 112 is formed at a location deep in the P-type active layer 103, extending throughout the high breakdown voltage PMOS FET 100b, as illustrated in FIG. 4, and therefore, the high energy implantation N-type region 112a is formed, extending throughout the high breakdown voltage PMOS FET 100b, as illustrated in FIG. 8A. Thereby, the high breakdown voltage PMOS FET 100b of the third embodiment can be fabricated, though detailed description thereof is omitted.

Eighth Embodiment

Next, as an eighth embodiment, a fabrication method of the high breakdown voltage semiconductor device of the fourth embodiment will be described with reference to the drawings.

FIGS. 9A to 9D are diagrams for explaining a fabrication process of the high breakdown voltage PMOS FET 100c of the fourth embodiment. Also in this case, the N-type deep well region 112 is formed, extending throughout the high breakdown voltage PMOS FET 100c, excluding under the P-type drain region 108. Therefore, the fabrication method of the eighth embodiment is similar to that of the high breakdown voltage PMOS FET 100, except that the high energy implantation N-type region 112a is formed at a corresponding location. Therefore, detailed description thereof is omitted.

What is claimed is:

1. A high breakdown voltage semiconductor device formed using an SOI substrate comprising a support substrate, an insulating film formed on the support substrate, and a second conductive type active layer formed on the insulating film, the device comprising:
   a first conductive type well region formed in an upper side of the second conductive type active layer;
   a second conductive type drain offset region formed in the upper side of the second conductive type active layer and apart from the well region;
   a second conductive type source region formed in an upper side of the well region;
   a second conductive type drain region formed in an upper side of the drain offset region;
   a gate insulating film formed in at least a region interposed between the source region and the drain offset region in the active layer; and
   a gate electrode formed on the gate insulating film,
   wherein the device further comprises a first conductive type deep well region formed under the drain offset region of the active layer, and a lower surface of the deep well region is in contact with the insulating film,
   a second conductive type impurity introduced for formation of the drain offset region has a concentration profile in which a concentration peak is located in the vicinity of a surface of the active layer, and
   a first conductive type impurity introduced for formation of the deep well region has a concentration profile in which a concentration peak is located deeper than the concentration peak of the second conductive type impurity and the first conductive type impurity concentration decreases toward the surface of the active layer.

2. The high breakdown voltage semiconductor device of claim 1, wherein the deep well region is formed under the drain offset region, and
   there is no overlap region between the deep well region and the drain region in a plan view.

3. The high breakdown voltage semiconductor device of claim 1, wherein the deep well region is formed under at least the drain offset region and the well region, and
   the concentration peak of the first conductive type impurity introduced for formation of the deep well region is located deeper than a concentration peak of the first conductive type impurity for formation of the well region.

4. The high breakdown voltage semiconductor device of claim 1, wherein the deep well region is formed under at least the drain offset region and the well region, and
   there is no overlap region between the deep well region and the drain region in a plan view.

5. The high breakdown voltage semiconductor device of claim 1, wherein the concentration peak of the second conductive type impurity introduced for formation of the drain offset region is higher than that of the first conductive type impurity introduced for formation of the deep well region.

* * * * *